(12) United States Patent
Noh et al.

(10) Patent No.: US 11,747,850 B2
(45) Date of Patent: Sep. 5, 2023

(54) CURRENT GENERATING CIRCUIT AND OSCILLATOR USING CURRENT GENERATING CIRCUIT

(71) Applicant: MagnaChip Semiconductor, Ltd., Cheongju-si (KR)

(72) Inventors: Jin Seop Noh, Cheongju-si (KR); Hyoung Kyu Kim, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 187 days.

(21) Appl. No.: 17/227,810

(22) Filed: Apr. 12, 2021

(65) Prior Publication Data

US 2022/0004215 A1    Jan. 6, 2022

(30) Foreign Application Priority Data

Jul. 2, 2020   (KR) .................. 10-2020-0081279

(51) Int. Cl.
*G05F 3/26* (2006.01)
*H03B 5/04* (2006.01)

(52) U.S. Cl.
CPC .............. *G05F 3/262* (2013.01); *H03B 5/04* (2013.01)

(58) Field of Classification Search
CPC ... G05F 3/262; G05F 3/26; G05F 3/20; G05F 3/16; G05F 3/10; G05F 3/08; G05F 3/02
See application file for complete search history.

(56) References Cited

U.S. PATENT DOCUMENTS

| | | | |
|---|---|---|---|
| 7,915,950 B2 * | 3/2011 | Rosik ................. | G05F 3/08 324/202 |
| 8,933,684 B2 * | 1/2015 | Wang ................. | G05F 3/16 323/316 |
| 9,946,290 B2 | 4/2018 | Kim et al. | |
| 10,804,888 B1 * | 10/2020 | Wang ................. | G05F 3/262 |
| 2012/0119819 A1 | 5/2012 | Pyo et al. | |

FOREIGN PATENT DOCUMENTS

| KR | 10-2012-0051442 A | 5/2012 |
|---|---|---|
| KR | 10-2017-0025904 A | 3/2017 |

* cited by examiner

*Primary Examiner* — Diana J. Cheng
(74) *Attorney, Agent, or Firm* — NSIP Law (57) ABSTRACT

A current generating circuit includes a current generator configured to supply a reference current, switches connected to the current generator, wherein one switch of the switches is selected and configured to operate, according to a switch selection signal, and one or more resistors, respectively connected to the switches, wherein a rate of current change according to a temperature change of the current generator is adjusted based on a temperature coefficient of resistance (TCR) of resistors connected to the one switch, according to adjustment of the one switch.

17 Claims, 11 Drawing Sheets

CURRENT GENERATING CIRCUIT AND OSCILLATOR USING CURRENT GENERATING CIRCUIT

CROSS-REFERENCE TO RELATED APPLICATIONS

This application claims the benefit under 35 U.S.C. 119(a) of Korean Patent Application No. 10-2020-0081279 filed on Jul. 2, 2020 in the Korean Intellectual Property Office, the entire disclosure of which is incorporated herein by reference for all purposes.

BACKGROUND

1. Field

The following description relates to a current generating circuit. The following description also relates to a current generating circuit having a Beta-Multiplier Reference (BMR) circuit with an improved structure providing an ability to arbitrarily adjust the frequency characteristic according to the temperature of the oscillator by adjusting the rate of current change according to the temperature of the BMR circuit. The following description also relates to an oscillator using such a current generating circuit.

2. Description of Related Art

In an integrated circuit, an oscillation signal may be used in various ways. For example, the operation of an integrated circuit that processes digital signals may be synchronized to an oscillation signal or a clock signal, and an oscillation signal may be used to process analog signals, such as a signal in an RF band.

Oscillators may be widely used to generate such oscillation signals. However, there may be a problem in that when the temperature of the integrated circuit changes, the oscillation frequency of the oscillator may also be affected and changed.

A reference current circuit may be used for the oscillator. As a reference current circuit, a Beta-Multiplier Reference (BMR) circuit capable of stably outputting current regardless of an external power supply is widely used. In the case of an oscillator using a BMR circuit, the frequency of the oscillator may still change along with temperature.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a current generating circuit includes a current generator configured to supply a reference current, switches connected to the current generator, wherein one switch of the switches is selected and configured to operate, according to a switch selection signal, and one or more resistors, respectively connected to the switches, wherein a rate of current change according to a temperature change of the current generator is adjusted based on a temperature coefficient of resistance (TCR) of resistors connected to the one switch, according to adjustment of the one switch.

The current generator may be a Beta-Multiplier Reference (BMR) circuit.

The BMR circuit may include a current mirror circuit including a plurality of transistors that are configured to be turned-on to operate according to the operation of a driving switch to supply a first current and a second current, and a voltage comparator comprising a plurality of transistors configured to compare a first voltage and a second voltage generated according to the first current and the second current.

The current mirror circuit may include a first transistor and a second transistor each having a source terminal connected to a supply voltage terminal, and having gate terminals connected to each other, a third transistor that is connected to a drain terminal of the first transistor and has a source terminal connected to the switch, a fourth transistor that is connected to a drain terminal of the second transistor and has a source terminal that is grounded, and the first transistor and the second transistor may be part of a current mirror.

The voltage comparator may include a fifth transistor and a sixth transistor, each having a source terminal connected to the supply voltage terminal and having gate terminals connected to each other, a seventh transistor of which a gate terminal is connected to the third transistor, a drain terminal is connected to a drain terminal of the fifth transistor, and a source terminal is grounded, and an eighth transistor of which a gate terminal is connected to the fourth transistor, a drain terminal is connected to the sixth transistor, and a source terminal is grounded.

The switches may include a first switch, a second switch and a plurality of switches located between the first switch and the second switch.

The resistors may include first type resistors directly connected to the first switch and the plurality of switches, and second type resistors including resistors directly connected to the second switch and resistors connected in series with the first type resistors.

The first type resistors may have a same TCR, and the second type resistors may have a TCR of an opposite tendency to the same TCR of the first type resistors.

A resistor connected to the first switch may have a temperature-current graph of a first slope, and a resistor connected to the second switch may have a temperature-current graph of a second slope.

The first slope may be smaller than the second slope, and the temperature-current graph of the resistors connected to the plurality of switches may be located between the temperature-current graph of the first slope and the temperature-current graph of the second slope.

In another general aspect, a current generating circuit includes a current generator configured to supply a reference current, switches connected to the current generator, wherein any one switch of the switches is selected and configured to operate, according to a switch selection signal, and resistors comprising two groups that are selectively connected to the current generator through the switches, and having temperature coefficient of resistances (TCRs) of opposite tendencies according to temperature changes.

The switches may include a first switch, a second switch and a plurality of switches located between the first switch and the second switch.

The resistors may include first type resistors directly connected to the first switch and the plurality of switches, and second type resistors including resistors directly connected to the second switch and resistors connected in series with the first type resistors.

The first type resistors may have a temperature coefficient of resistance (TCR) that causes increases in resistance according to a temperature of the first type resistors, and the second type resistors may have a TCR that causes decreases in resistance according to a temperature of the second type resistors.

A resistor connected to the first switch may have a temperature-current graph of a first slope, and wherein the temperature-current graph of the resistor connected to the second switch may have a slope greater than the temperature-current graph of the first slope.

The temperature-current graph of the resistors connected to the plurality of switches may be located between the temperature-current graph of the first slope and the temperature-current graph of the second slope.

In another general aspect, an oscillator includes a current generator configured to supply a reference current, switches connected to the current generator, wherein one switch is selected and operates according to a switch selection signal, and one or more resistors, respectively connected to the switches, and a current generating circuit configured to adjust a rate of current change according to a temperature change of the current generator by a temperature coefficient of resistance (TCR) of resistors connected to the one switch according to adjustment of the switch, wherein the oscillator is capable of revising a frequency characteristic according to a temperature change by adjusting a rate of current change according to the temperature change.

The one or more resistors may include of first type resistors directly connected to some of the switches; and second type resistors connected in series with the first type resistors.

The first type resistors may have a first TCR, and the second type resistors may have a second TCR of the opposite tendency to the first TCR.

The oscillator may further include a switch directly connected only to the first type resistor and a switch directly connected only to the second type resistor.

Other features and aspects will be apparent from the following detailed description, the drawings, and the claims.

Other features and aspects will be apparent from the following detailed description, the drawings, and the claims.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application, and are not to be interpreted in an idealized or overly formal sense unless expressly so defined herein.

Terms such as "including" or "comprising" used in the embodiments should not be construed as necessarily including all of various components, or various operations described in the specification, and it should be construed that some of the components or some of the operations may not be included or may further include additional components or operations.

The use of the term "may" herein with respect to an example or embodiment (e.g., as to what an example or embodiment may include or implement) means that at least one example or embodiment exists where such a feature is included or implemented, while all examples are not limited thereto.

Objects and effects, and technical configurations for achieving them of the present disclosure are apparent with reference to the examples described below in detail with the accompanying drawings. In describing the present disclosure, when it is judged that a detailed description of a known function or configuration may unnecessarily obscure the subject matter of the present disclosure, the detailed description thereof is omitted.

The following terms are defined in consideration of functions in the present disclosure, which may vary depending on the user, intention or custom of the operator.

However, the present disclosure is not limited to the examples disclosed below, but may be implemented in various forms. The present examples are merely provided to complete the disclosure of the present disclosure and to fully inform those skilled in the art the scope of the present disclosure, and the present disclosure is defined by the scope of the claims. Therefore, the definition should be made based on the contents throughout the specification.

Figure 1A:
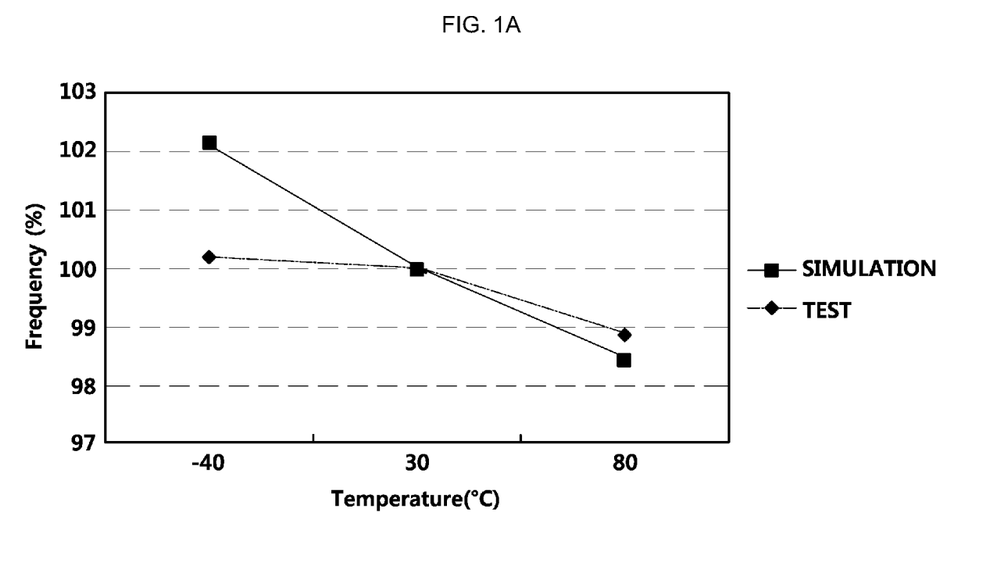
FIGS. 1A-1C are graphs illustrating a degree of change in frequency according to a temperature of an oscillator for each semiconductor process, according to one or more examples.
Figure 1B:
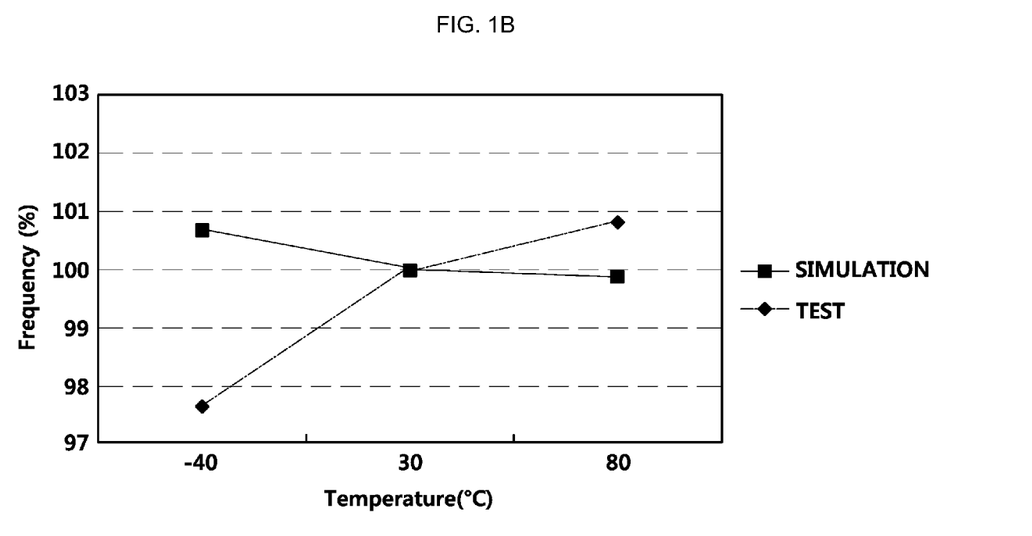
Figure 1C:
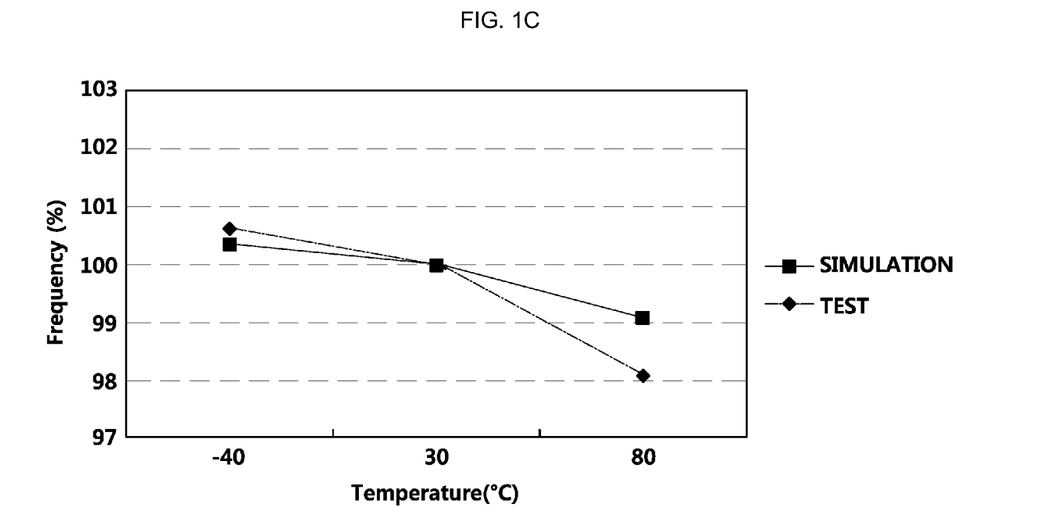

FIGS. 1A-1C are graphs illustrating a degree of change in frequency according to a temperature of an oscillator for each semiconductor process. As illustrated in the temperature-frequency graphs of FIGS. 1A-1C, depending on the process used for design, simulation results and test results may be similar. However, there may be many cases where simulation results and test results are not the same. For example, with respect to the process used in FIGS. 1A and 1B, simulation results and test results may not be similar, while as for the process used in FIG. 10, simulation results and test results may be generally similar. Such results are generally due to the unique characteristics of the processes provided by a foundry company. Therefore, depending on the process, simulation results and test results may be similar or may not be similar.

Simulation results and test results may not necessarily be similar. Various devices used for constituting semiconductor devices, for example, MOSFETs, resistors, capacitors, etc., as non-limiting examples, may necessarily be changed according to temperature. Therefore, even though devices may be designed according to simulation results, there may be a difference in operation when comparing simulation results and test results. Therefore, there may be a desire to check the frequency characteristic according to the temperature in the test results of the oscillator and revise it to match the desired characteristic.

Figure 2:
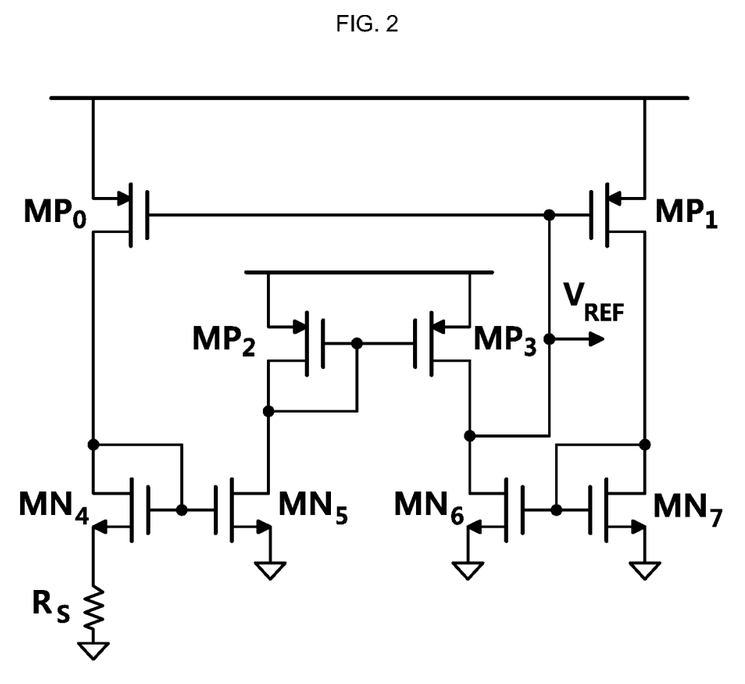
FIG. 2 is a configuration diagram of a BMR circuit of a typical art.

However, in the BMR circuit of a typical art, there is no configuration capable of adjusting the rate of current change according to temperature, and accordingly, there is an issue that the frequency characteristic according to the temperature of the oscillator is not able to be adjusted. That is, because the BMR circuit of a typical art uses one resistor $R_S$ having a fixed temperature coefficient of resistance (TCR), as illustrated in FIG. 2, the frequency characteristic according to the temperature of the oscillator may not be able to be adjusted.

Figure 3A:
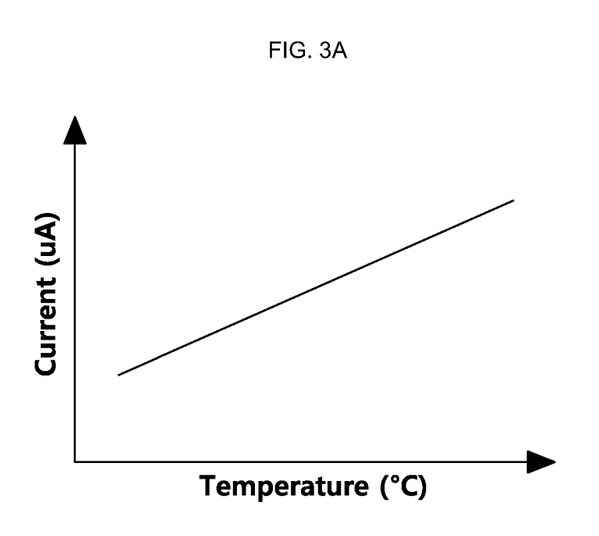
FIG. 3A is a graph illustrating a current change according to a temperature of the BMR circuit of a typical art.
Figure 3B:
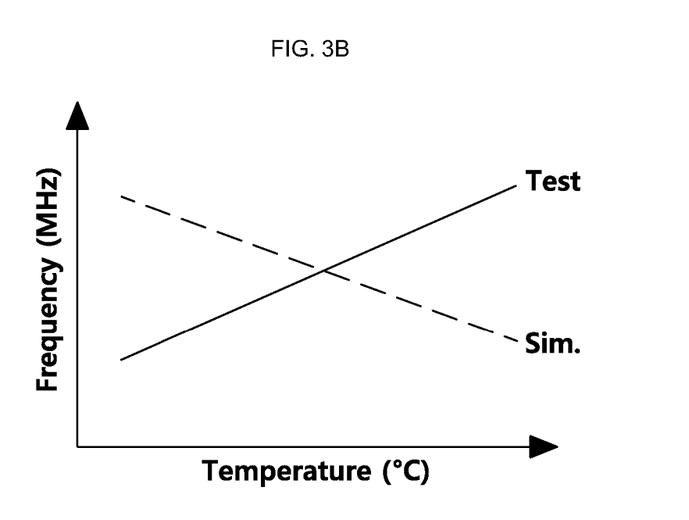
FIGS. 3B and 3C are graphs illustrating the frequency change according to a temperature for a test and simulation results of an oscillator of a typical art.
Figure 3C:
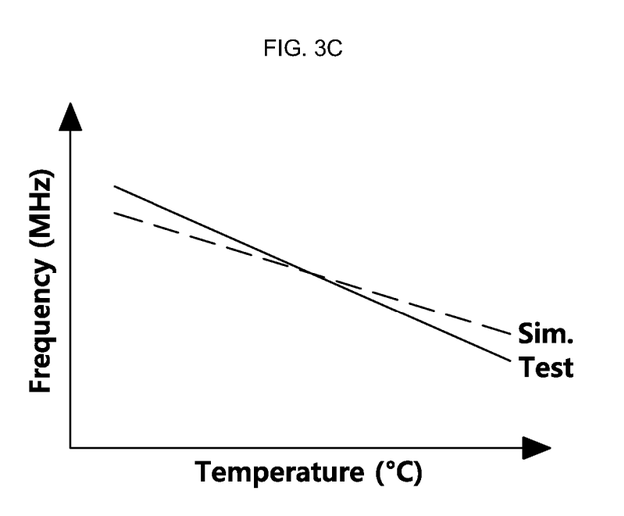

That is, if the BMR circuit is not able to adjust the rate of current change according to the temperature using one resistor RS having a fixed TCR, as illustrated in FIG. 3A, the frequency characteristic according to the temperature of the oscillator may not be able to be changed. If the frequency characteristic according to the temperature of the oscillator has its simulation result similar to the test result, as illustrated in FIG. 3C, there may be no requirement to revise it, but it may be required to be revised if the frequency characteristic according to the temperature of the oscillator has the test result different from the simulation result, as illustrated in FIG. 3B. However, the BMR circuit of a typical art is not able to revise the frequency characteristic according to the temperature of the oscillator because the rate of current change according to the temperature may not be able to be adjusted.

Therefore, the present examples provide a current generating circuit capable of configuring N number of resistors having different TCR in the BMR circuit, and capable of adjusting the rate of current change according to the temperature of the BMR circuit according to the connection of the resistors.

Another aspect of the present examples is to control a frequency characteristic according to a temperature of an oscillator by adjusting the rate of current change according to a temperature of a BMR circuit.

Hereinafter, the present examples are described in more detail based on the examples illustrated in the drawings.

Figure 4:
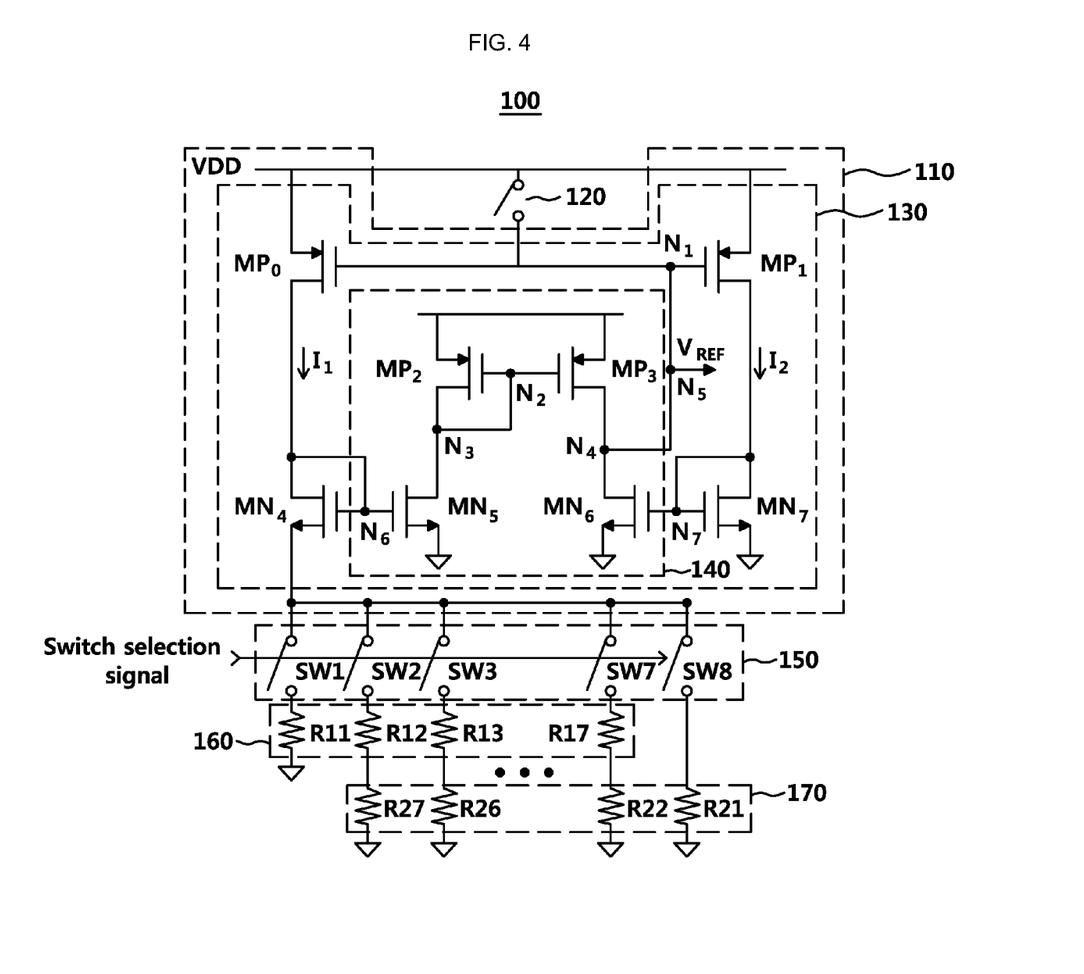
FIG. 4 is a configuration diagram of a current generating circuit, according to one or more examples.

FIG. 4 is a configuration diagram of a current generating circuit, according to one or more examples. As illustrated in FIG. 4, the current generating circuit 100 may include a driving switch 120, a current generator 110 including a current mirror unit 130 and a voltage comparator 140, switches 150, and resistors 160, 170, according to a non-limiting example. In the present non-limiting example, a BMR circuit may be used in the current generator 110. Thus, the current generator 110 may described as being a "BMR circuit unit."

The driving switch 120 may operate by turning-on/turning-off to enable/disable the BMR circuit unit 110, and one end of the driving switch may be connected to the supply voltage terminal VDD. In the present example, in a state in which the driving switch 120 is connected (a turned-on state), the BMR circuit unit 110 may be in a non-driving state. In a state in which the driving switch 120 is blocked state (a turned-off state), the BMR circuit unit 110 may be in a driving state. The operation of the BMR circuit unit 110 is described in greater detail, below.

The current mirror unit 130 may include a plurality of switching transistors MP0, MP1, MN4 and MN7. When the driving switch 120 is turned off, the transistors MP0, MP1, MN4, and MN7 may turn-on to operate to form a current flow path, wherein the MP0 and MP1, MN4 and MN7 thereby constitute a current mirror. The source terminals of the MP0 and MP1 may be connected to the supply voltage terminal VDD, and the gate terminals may be connected to each other to form node 1 N1. The drain terminals of MP0 and MP1 may be connected to the drain terminals of MN4 and MN7, respectively, switches 150 may be connected to the source terminal of the MN4, and the source terminal of MN7 may be grounded.

The transistors may also be referred to such that MP0 is a first transistor, MP1 is a second transistor, MN4 is a third transistor, and MN7 is a fourth transistor.

The voltage comparator 140 may include a plurality of transistors MP2, MP3, MN5 and MN6 used for voltage comparison. The source terminals of MP2 and MP3 may be connected to the supply voltage terminal VDD, and the gate terminals may be connected to each other to form node 2 N2. The drain terminals of MP2 and MP3 may be connected to the drain terminals of MN5 and MN6, respectively, and the source terminals of MN5 and MN6 may be grounded. The node 2 N2 may be connected to node 3 N3 between MP2 and MN5, and node 1 N1 may be connected to node 4 N4 between MP3 and MN6. Between the node 1 N1 and the node 4 N4, a node 5 N5, which is an output terminal of the reference voltage, may be provided.

The transistors may also be referred to such that MP2 is a fifth transistor, MP3 is a sixth transistor, MN5 is a seventh transistor, and MN6 is an eighth transistor.

Meanwhile, the gate terminals of MN4 and MN5 may be connected to each other to form node 6 N6, and the node 6 N6 may be connected to a drain terminal side of MN4. In addition, gate terminals of MN6 and MN7 may be connected to each other to form node 7 N7, and the node 7 N7 may be connected to a drain terminal side of MN7.

Such a BMR circuit unit 110 may have an node 5 N5, which is the reference voltage output terminal, which may be directly connected to the supply voltage terminal VDD when the driving switch 120 is turned on. Therefore, the BMR circuit unit 110 may maintain a non-driving state. On the other hand, when the driving switch 120 is turned off, the transistors MP0 and MP1 connected to the power voltage terminal VDD may be turned on and currents 11 and 12 may flow. In addition, a first voltage and a second voltage may be generated in node 6 N6 and node 7 N7 according to such currents 11 and 12.

Transistors MP2 and MN5, MP3 and MN6 of the voltage comparator 140 may compare a first voltage and a second voltage generated at the node 6 N6 and the node 7 N7, and the output voltage may continuously feedback and change until the first voltage and the second voltage are the same. In addition, when the first voltage and the second voltage are maintained constantly, a reference current may flow constantly and may be provided to an oscillator.

In a typical art, the rate of current change according to the temperature of a BMR circuit may be fixed by a resistor having a constant temperature coefficient of resistance. Thus, it may not be possible to revise the frequency characteristic according to the temperature of the oscillator. On the other hand, the present examples may provide a configuration that may be capable of adjusting the rate of current change according to the temperature of the BMR circuit unit 110.

As illustrated in FIG. 4, the BMR circuit unit 110 of the present examples may include switches SW1 to SW8, one of which is selected according to a series of switch selection signals, and resistors connected to the switches SW1 to SW8, respectively. The resistors may be provided in a configuration for adjusting a rate of current change according to the temperature of the BMR circuit unit 110 according to the temperature. Thus, adjusting the rate of current change according to the temperature of the BMR circuit unit 110 may therefore mean that the frequency characteristic according to the temperature of the oscillator may be adjustable.

The resistors 160 and 170 may be resistors having at least one or two or more different TCR and may be connected to each switch SW1 to SW8. Specifically, the resistors may be connected to the first to eighth switches SW1 to SW8 that assume turned-on/turned-off operation according to a switch selection signal applied from the outside. The switch selection signal turns on only one of the first to eighth switches SW1 to SW8. In such a non-limiting example, one end of the first to eighth switches SW1 to SW8 is connected to the source terminal of the MN4, and one or more resistors are connected to each switch SW1 to SW8.

In the present non-limiting example, the number of the switches and the resistors is specified, but the number of the switches and the resistors is not to be limited thereto.

In FIG. 4, resistors may be divided into first type resistors 160 and second type resistors 170. For example, the first type resistors 160 are resistors connected to first to seventh switches SW1 to SW7, and the second type resistors 170 are connected to second to eighth switches SW2 to SW8. One side of the resistors of the second type resistors 170 may be connected to the first type resistors 160 and the other side may be grounded as illustrated in FIG. 4. Only one first type resistor and one second type resistor may be connected to the first switch SW1 and the eighth switch SW8, respectively.

The first type resistors 160 configured to 1-1 resistor R11, 1-2 resistor R12, 1-3 resistor R13, 1-4 resistor R14, 1-5 resistor R15, 1-6 resistor R16, 1-7 resistor R17. The second type resistors 170 configured to 2-1 resistor R21, 2-2 resistor R22, 2-3 resistor R23, 2-4 resistor R24, 2-5 resistor R25, 2-6 resistor R26, and 2-7 resistor R27. In the present example, a TCR of the first type resistors 160 is about 40.63 Ω/° C., and a TCR of the second type resistors 170 is about −1.64 Ω/° C.

According to the examples, if the first type resistors 160 have a resistance of 1KΩ at 30° C. (i.e., room temperature), the first type resistors 160 may have about 1.04063KΩ at 31° C. In addition, if the second type resistors 170 have a resistance of 1KΩ at 30° C., the second type resistors 170 may have about 0.99836KΩ at 31° C.

According to the non-limiting example of FIG. 4, the first switch SW1 may be connected only to the 1-1 resistor R11, and only the 2-1 resistor R21 may be connected to the eighth switch SW8. To the second switch SW2, the 1-2 resistor R12 and the 2-7 resistor R27 are connected in series. To the third switch SW3, the 1-3 resistor R13 and the 2-6 resistor R26 are connected in series. To the fourth switch SW4, the 1-4 resistor R14 and the 2-5 resistor R25 are connected in series. To the fifth switch SW5, the 1-5 resistor R15 and the 2-4 resistor R24 are connected in series. To the sixth switch SW6, the 1-6 resistor R16 and the 2-3 resistor R23 are connected in series. To the seventh switch SW7, the 1-7 resistor R17 and the 2-2 resistor R22 are connected in series.

FIG. 4 illustrates, as a non-limiting example, a way in which the 1-1 resistor R11 to the 1-7 resistor R17 and the 2-1 resistor R21 to the 2-7 resistor R27 may be connected alone. However, seven of the 1-1 resistor R11 and the 2-1 resistor R21 may be connected in series. Six of the 1-2 resistor R12 and 2-2 resistor R22 may be connected in series. Five of the 1-3 resistor R13 and the 2-3 resistor R23 may be configured in series. Four of the 1-4 resistor R14 and 2-4 resistor R24 may be connected in series. Three of the 1-5 resistor R15 and the 2-5 resistor R25 may be configured in series. Two of the 1-6 resistor R16 and 2-6 resistor R26 may be connected in series. One of 1-7 resistor R17 and 2-7 resistor R27 may be connected in series.

Therefore, the values obtained by adding the TCR of resistors connected in series with respect to the first switch SW1 to the eighth switch SW8 may be different, respectively. In addition, the value obtained by adding the TCR of the resistors connected in series to the second switch SW2 to seventh switch SW7 may be smaller than the TCR of the resistor connected to the first switch SW1, and may be greater than the TCR of the resistor connected to the eighth switch SW8.

According to this non-limiting configuration, when driving the BMR circuit unit 110 while connecting any one switch connecting a resistor having a different TCR, the rate of current change according to the temperature of the BMR circuit unit 110 may be adjusted. That is, the rate of current change according to the temperature of the BMR circuit unit 110 may be determined in response to the TCR of the resistance connected according to the turned-on operation of the switches SW1 to SW8. And the slope of the temperature-current when the 2-1 resistor R21 only is connected may be greater than the slope of the temperature-current when the 1-1 resistor R11 only is connected. Also, the temperature-current slope according to the resistances connected to the second switch SW2 to seventh switch SW7 may be located between the slope of temperature-current according to the resistance connected to the first switch SW1 and the slope of temperature-current according to the resistance connected to the eighth switch SW8.

Figure 5:
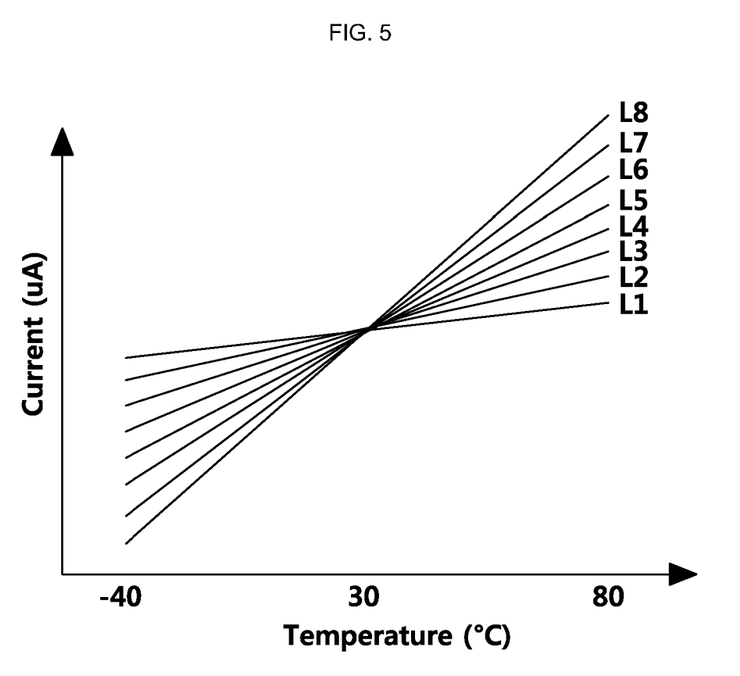
FIG. 5 is a graph illustrating a current change according to a temperature of a current generating circuit, according to one or more examples.

Referring to FIG. 5, the first slope L1 may correspond to an example in which only the first switch SW1 may be turned on and the rest of the switches SW2 to SW8 may be turned off so that only the 1-1 resistance R11 is connected. By contrast, the eighth slope L8 may occur when only the eighth switch SW8 is turned on, and the rest of the switches SW1 to SW7 may be turned off so that only the 2-1 resistor R21 is connected. The eighth slope L8 may be greater than the first slope L1. In addition, when any one of the second switch SW2 to seventh switch SW7 is connected, the temperature-current graph may be changed according to the TCR of the resistors that are connected in series to the switch, wherein the slopes L2 to L7 of the temperature-current graph according to the connection of the second switch SW2 to the seventh switch SW7 are located between the first slope L1 and the eighth slope L8. The second slope L2 to seventh the slope L7 of FIG. 5 correspond to this description of the non-limiting example.

As described above, the present non-limiting examples may be capable of adjusting the rate of current change according to the temperature of the BMR circuit unit 110 according to the switching operation, which may be different from the typical art in which the rate of current change according to the temperature of the BMR circuit unit may be fixed to a predetermined temperature coefficient of resistance (TCR). In addition, by being able to adjust the rate of current change according to the temperature of the BMR circuit unit 110, as in the present examples, it may become possible to adjust the frequency characteristic appropriately according to the temperature of the oscillator.

Figure 6A:
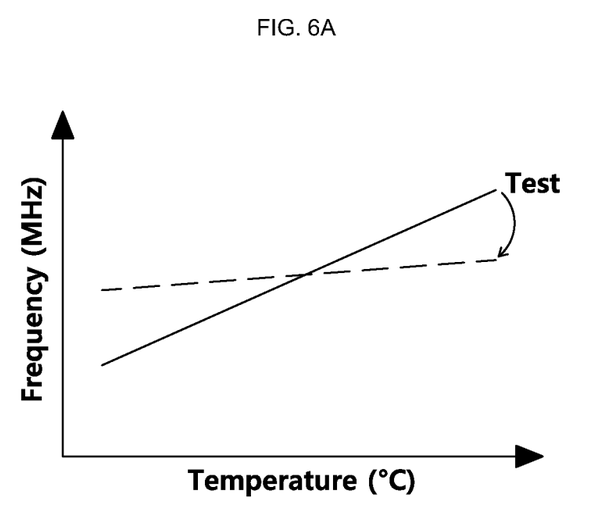
FIGS. 6A-6B are graphs illustrating revising the frequency characteristic according to a temperature of an oscillator, according to one or more examples.
Figure 6B:
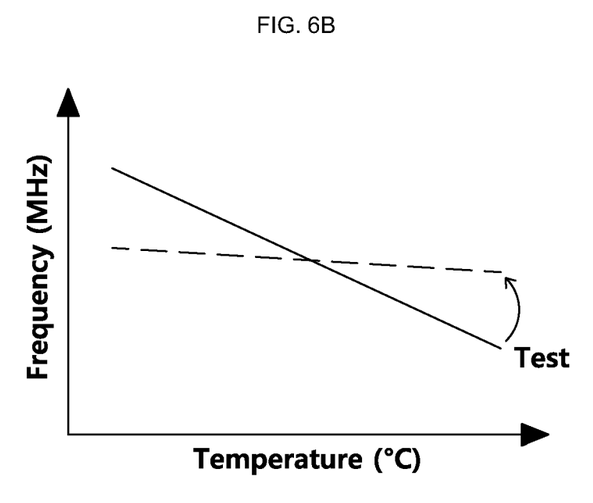

FIGS. 6A and 6B are graphs illustrating revising the frequency characteristic according to the temperature of the oscillator of the present examples. The present examples are to adjust the frequency characteristic according to the temperature of the oscillator when revising the slope according to the test results as illustrated in FIGS. 6A and 6B. Specifically, in FIG. 6A, when another switch is turned on so that a resistor having a TCR higher than the currently connected resistor is connected, the rate of current change according to the temperature of the BMR circuit unit 110 may change, and the corresponding temperature-frequency slope of the oscillator may also be more gentle than the slope before revising.

Likewise, in FIG. 6B, when the other switch is turned on so that a resistor having a TCR lower than the currently connected resistor may be connected, a rate of current change according to the temperature of the BMR circuit unit 110 may change, thereby being able to revise slope of the corresponding temperature-frequency of the oscillator. That is, it may be possible to revise the frequency characteristic according to the temperature of the oscillator.

Figure 7:
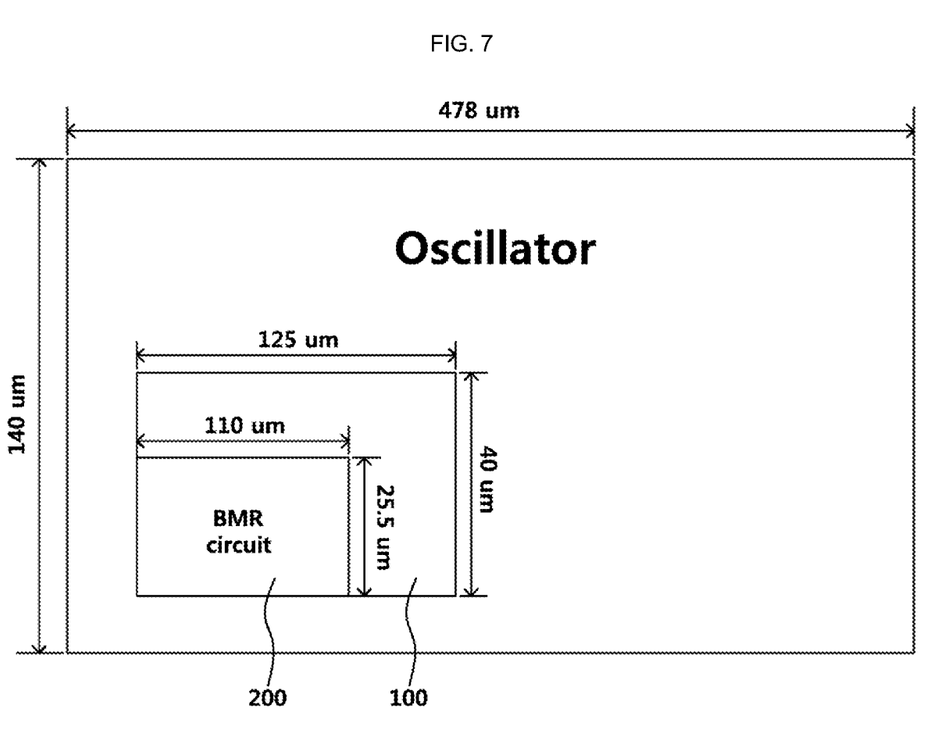
FIG. 7 is a view comparing the area occupied by a BMR circuit of a typical art and a BMR circuit according to one or more examples.

FIG. 7 is a view comparing the area occupied by the BMR circuit of an alternative art and the BMR circuit of the present examples in the oscillator. For example, the layout area of both the oscillator of the typical art and the present examples is 66,920 $\mu m^2$ (478 $\mu m \times 140$ $\mu m$).

As illustrated in FIG. 7, the layout of the BMR circuit 200 of a typical art is 2,805 $\mu m^2$ (110 $\mu m * 25.5$ $\mu m$), and thus the area occupied by the BMR circuit 200 in the oscillator is 4.2% of the layout area.

On the other hand, in the BMR circuit 100 of the present examples, to which the switches 150 and the plurality of resistors are added, a layout area may be approximately 5,067 $\mu m^2$ (125 $\mu m * 40$ $\mu m$), that thereby occupies about 7.3% of the total area of the oscillator. Specifically, the first type resistors may be 39.8 $\mu m * 0.4$ $\mu m * \{73+35(dummy)\}$ which is 1,735 $\mu m^2$, and the second type resistors may be 7 $\mu m * 4$ $\mu m * \{79+40(dummy)\}$ which is 3,332 $\mu m^2$. That is, even if the structure is improved to be made able to adjust the frequency of the oscillator, the area occupied by the BMR circuit in the oscillator may be neglected to some extent.

FIG. 7 exemplifies similar numbers so as to know how much area is occupied in the oscillator by the BMR circuit of a typical art 200 and the BMR circuit 100 of the present examples. however, the numbers are only non-limiting examples used for purposes of illustrative discussion. The oscillator and the BMR circuit may be designed in different sizes. Nevertheless, the ratio of the BMR circuit of the present disclosure occupied in the total area of the oscillator is negligible compared to the ratio of the BMR circuit of a typical art occupies in the total area of the oscillator, which may means that it does not significantly affect the design of the oscillator.

According to the present disclosure as described above, it is possible to adjust the frequency characteristic according to the temperature of the oscillator by connecting the resistors having different temperature coefficient of resistances (TCRs) and by adjusting the rate of current change according to the temperature of the BMR circuit according to the operation of the switch. Therefore, the frequency characteristic according to the temperature of the oscillator may be revised according to the test results, appropriately.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A current generating circuit comprising:
   a current generator configured to supply a reference current;
   switches connected to the current generator, wherein one switch of the switches is selected and configured to operate, according to a switch selection signal; and
   one or more resistors, respectively connected to the switches,
   wherein a rate of current change according to a temperature change of the current generator is adjusted based on a temperature coefficient of resistance (TCR) of resistors connected to the one switch, according to adjustment of the one switch,
   wherein the one or more resistors connected to the switches comprise first type resistors each having a same TCR and second type resistors each having a TCR of the opposite tendency to the same TCR of the first type resistors, each of the one or more resistors being either a first type resistor or a second type resistor, and
   wherein the rate of current change according to the temperature change is lowest when the switches connect the current generator to one of the first type resistors, and is greatest when the switches connect the current generator to one of the second type resistors.

2. The current generating circuit of claim 1, wherein the current generator is a Beta-Multiplier Reference (BMR) circuit.

3. The current generating circuit of claim 2, wherein the BMR circuit comprises:
   a current mirror circuit comprising a plurality of transistors configured to be turned-on to operate according to an operation of a driving switch to supply a first current and a second current; and
   a voltage comparator comprising a plurality of transistors configured to compare a first voltage and a second voltage generated according to the first current and the second current.

4. The current generating circuit of claim 3, wherein the current mirror circuit comprises:
   a first transistor and a second transistor each having a source terminal connected to a supply voltage terminal, and having gate terminals connected to each other;
   a third transistor that is connected to a drain terminal of the first transistor and has a source terminal connected to the switches,
   a fourth transistor that is connected to a drain terminal of the second transistor and has a source terminal that is grounded, and
   wherein the first transistor and the second transistor are part of a current mirror.

5. The current generating circuit of claim 4, wherein the voltage comparator comprises:
   a fifth transistor and a sixth transistor, each having a source terminal connected to the supply voltage terminal and having gate terminals connected to each other;
   a seventh transistor of which a gate terminal is connected to the third transistor, a drain terminal is connected to a drain terminal of the fifth transistor, and a source terminal is grounded, and
   an eighth transistor of which a gate terminal is connected to the fourth transistor, a drain terminal is connected to the sixth transistor, and a source terminal is grounded.

6. The current generating circuit of claim 1, wherein the switches comprise a first switch, a second switch and a plurality of switches located between the first switch and the second switch.

7. The current generating circuit of claim 6, wherein the first type resistors are directly connected to the first switch and the plurality of switches; and the second type resistors are directly connected to the second switch and connected in series with the first type resistors.

8. The current generating circuit of claim 7, wherein a first resistor connected to the first switch has a temperature-current graph of a first slope, and
   wherein a second resistor connected to the second switch has a temperature-current graph of a second slope.

9. The current generating circuit of claim 8, wherein the first slope is smaller than the second slope, and
   wherein the temperature-current graph of the resistors connected to the plurality of switches is located between the temperature-current graph of the first slope and the temperature-current graph of the second slope.

10. A Beta-Multiplier Reference (BMR) circuit, comprising:
    a current generator configured to supply a reference current;
    switches connected to the current generator, wherein any one switch of the switches is selected and configured to operate, according to a switch selection signal; and
    resistors comprising two groups that are selectively connected to the current generator through the switches, and having temperature coefficient of resistances (TCRs) of opposite tendencies according to temperature changes,
    wherein the resistors comprise first type resistors each having a same TCR and second type resistors each having a TCR of the opposite tendency to the same TCR of the first type resistors,
    wherein the switches comprise a first switch, a second switch and a plurality of switches located between the first switch and the second switch, and
    wherein the first switch is directly connected to one of the first type resistors, and the second switch is directly connected to one of the second type resistors.

11. The current generating circuit of claim 10, wherein the first type resistors are directly connected to the plurality of switches, and the second type resistors are connected in series with the first type resistors.

12. The current generating circuit of claim 11, wherein the same TCR of the first type resistors causes increases in resistance according to a temperature of the first type resistors, and wherein the TCR of the second type resistors causes decreases in resistance according to a temperature of the second type resistors.

13. The current generating circuit of claim 12, wherein a first resistor connected to the first switch has a temperature-current graph of a first slope, and wherein the temperature-current graph of a second resistor connected to the second switch has a greater slope than the temperature-current graph of the first slope.

14. The current generating circuit of claim 13, wherein the temperature-current graph of the resistors connected to the plurality of switches is located between the temperature-current graph of the first slope and the temperature-current graph of the second slope.

15. An oscillator comprising:
a current generator configured to supply a reference current;
switches connected to the current generator, wherein one switch is selected and operates according to a switch selection signal; and
one or more resistors, respectively connected to the switches; and
a current generating circuit configured to adjust a rate of current change according to a temperature change of the current generator by a temperature coefficient of resistance (TCR) of resistors connected to the one switch according to adjustment of the switch,
wherein the oscillator is configured to revise a frequency characteristic according to a temperature change by adjusting a rate of current change according to the temperature change, and
wherein the one or more resistors connected to the switches comprise first type resistors each having a first TCR, and second type resistors each having a second TCR of the opposite tendency to the first TCR, each of the one or more resistors being either a first type resistor or a second type resistor, and
wherein the rate of current change according to the temperature change is lowest when the switches connect the current generator to one of the first type resistors, and is greatest when the switches connect the current generator to one of the second type resistors.

16. The oscillator of claim 15, wherein the first type resistors are directly connected to some of the switches; and the second type resistors are connected in series with the first type resistors.

17. The oscillator of claim 15, wherein the switches comprise a first switch directly connected to the one of the first type resistors and a second switch directly connected to the one of the second type resistors.

* * * * *